(12) United States Patent
Hung et al.

(10) Patent No.: US 11,133,237 B2
(45) Date of Patent: Sep. 28, 2021

(54) PACKAGE WITH EMBEDDED HEAT DISSIPATION FEATURES

(71) Applicant: Taiwan Semiconductor Manufacturing Company, Ltd., Hsinchu (TW)

(72) Inventors: Wensen Hung, Zhubei (TW); Szu-Po Huang, Taichung (TW); Hsiang-Fan Lee, Hsinchu (TW); Kim Hong Chen, Fremont, CA (US); Chi-Hsi Wu, Hsinchu (TW); Shin-Puu Jeng, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 16/852,964

(22) Filed: Apr. 20, 2020

(65) Prior Publication Data
US 2020/0251398 A1 Aug. 6, 2020

Related U.S. Application Data

(63) Continuation of application No. 15/984,592, filed on May 21, 2018, now Pat. No. 10,629,510, which is a
(Continued)

(51) Int. Cl.
*H01L 23/367* (2006.01)
*H01L 23/36* (2006.01)
(Continued)

(52) U.S. Cl.
CPC ............ *H01L 23/367* (2013.01); *H01L 23/13* (2013.01); *H01L 23/3114* (2013.01); *H01L 23/36* (2013.01); *H01L 23/4334* (2013.01); *H01L 25/0657* (2013.01); *H01L 25/105* (2013.01); *H01L 25/50* (2013.01); *H01L 23/49816* (2013.01); *H01L 23/49827* (2013.01); *H01L 23/49894* (2013.01); *H01L 2224/16225* (2013.01); *H01L 2224/73204* (2013.01); *H01L 2225/06513* (2013.01); *H01L 2225/06517* (2013.01); *H01L 2225/06541* (2013.01);
(Continued)

(58) Field of Classification Search
CPC combination set(s) only.
See application file for complete search history.

(56) References Cited

U.S. PATENT DOCUMENTS

| 5,311,402 | A | 5/1994 | Kobayashi et al. |
| 5,804,872 | A | 9/1998 | Miyano et al. |

(Continued)

*Primary Examiner* — Michelle Mandala
*Assistant Examiner* — Jordan M Klein
(74) *Attorney, Agent, or Firm* — Slater Matsil, LLP

(57) ABSTRACT

An integrated circuit package and a method of fabrication of the same are provided. An opening is formed in a substrate. An embedded heat dissipation feature (eHDF) is placed in the opening in the substrate and is attached to the substrate using a high thermal conductivity adhesive. One or more bonded chips are attached to the substrate using a flip-chip method. The eHDF is thermally attached to one or more hot spots of the bonded chips. In some embodiments, the eHDF may comprise multiple physically disconnected portions. In other embodiments, the eHDF may have a perforated structure.

20 Claims, 14 Drawing Sheets

Related U.S. Application Data continuation of application No. 14/213,890, filed on Mar. 14, 2014, now Pat. No. 9,978,660.

(51) Int. Cl.
   *H01L 25/065* (2006.01)
   *H01L 25/00* (2006.01)
   *H01L 23/13* (2006.01)
   *H01L 23/433* (2006.01)
   *H01L 23/31* (2006.01)
   *H01L 25/10* (2006.01)
   *H01L 23/498* (2006.01)

(52) U.S. Cl.
   CPC ............... *H01L 2225/06589* (2013.01); *H01L 2924/15311* (2013.01)

(56) References Cited

U.S. PATENT DOCUMENTS

| | | | |
|---|---|---|---|
| 6,154,364 A | 11/2000 | Girrens et al. | |
| 6,156,980 A | 12/2000 | Peugh et al. | |
| 6,184,580 B1 | 2/2001 | Lin | |
| 6,545,351 B1 | 4/2003 | Jamieson et al. | |
| 6,737,750 B1* | 5/2004 | Hoffman | H01L 25/0657 257/777 |
| 6,738,860 B2 | 5/2004 | Hashimoto et al. | |
| 7,339,268 B1 | 3/2008 | Ho et al. | |
| 2003/0057545 A1* | 3/2003 | Shim | H01L 23/3128 257/706 |
| 2005/0068739 A1 | 3/2005 | Arvelo et al. | |
| 2006/0261473 A1 | 11/2006 | Connah et al. | |
| 2006/0274497 A1* | 12/2006 | Yang | G06F 1/20 361/679.46 |
| 2009/0236733 A1 | 9/2009 | Chow et al. | |
| 2009/0309204 A1 | 12/2009 | Ha | |
| 2010/0059873 A1 | 3/2010 | Chow et al. | |
| 2010/0193942 A1 | 8/2010 | Railkar et al. | |
| 2012/0043669 A1 | 2/2012 | Refai-Ahmed et al. | |
| 2013/0208426 A1 | 8/2013 | Kim et al. | |
| 2013/0223010 A1 | 8/2013 | Shioga et al. | |
| 2014/0131847 A1 | 5/2014 | Yee et al. | |
| 2014/0327129 A1 | 11/2014 | Cho et al. | |
| 2014/0339692 A1 | 11/2014 | Kim et al. | |
| 2014/0340849 A1* | 11/2014 | Kim | H01L 23/36 361/717 |
| 2015/0061095 A1 | 3/2015 | Choi et al. | |

* cited by examiner

PACKAGE WITH EMBEDDED HEAT DISSIPATION FEATURES

PRIORITY CLAIM AND CROSS-REFERENCE

This application is a continuation of U.S. patent application Ser. No. 15/984,592, filed May 21, 2018, and entitled "Package with Embedded Heat Dissipation Features," which is a continuation of U.S. patent application Ser. No. 14/213,890, filed Mar. 14, 2014, now U.S. Pat. No. 9,978,660, issued May 22, 2018, and entitled "Package with Embedded Heat Dissipation Features," which applications are hereby incorporated herein by reference.

BACKGROUND

The continuous growth of the semiconductor industry is partly due to the constant improvements in the integration density of electronic components (i.e., transistors, diodes, resistors, capacitors, etc.) by reducing their physical sizes to allow for a greater number of components to be placed in a given chip area. Some improvements are two-dimensional (2D) in nature in that the devices are fabricated on the surface of a semiconductor wafer. And even though advancements in lithography have enabled each new technology generation to feature smaller sizes than the previous one, there is an eventual physical limitation to the minimum size needed to make these components function properly.

One solution to solving the problems discussed above is to stack dies on top of one another and interconnect or route them through connections such as through-substrate vias (TSVs). Such a configuration is named a three-dimensional integrated circuit (3DIC). Some of the benefits of 3DIC, for example, include exhibiting a smaller footprint, reducing power consumption by reducing the lengths of signal interconnects, and improving yield and fabrication cost if individual dies are tested separately prior to assembly.

A typical problem with 3DICs is heat dissipation during operation. Currently, most heat dissipation is performed by front side cooling with natural convection or by attaching a heat sink to the top of a package. In a 3DIC, for example, when a top die is stacked to a bottom die, a heat sink may be mounted on the top die. As a result, the top die may experience good heat-dissipating condition through natural convection with ambient air flow or with forced convection by utilizing a fan. However, the heat generated in the bottom die must travel through the potentially high thermal resistance of the top die in order to reach the heat sink. Hence, the bottom die may suffer from a heat-dissipation problem as its temperature will rise very quickly and exceed specifications. A prolonged exposure to excessive temperatures may decrease the reliability and operating lifetime of the die. This problem may become severe if the bottom die is a computing die such as a central processing unit (CPU), which generates significant heat.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
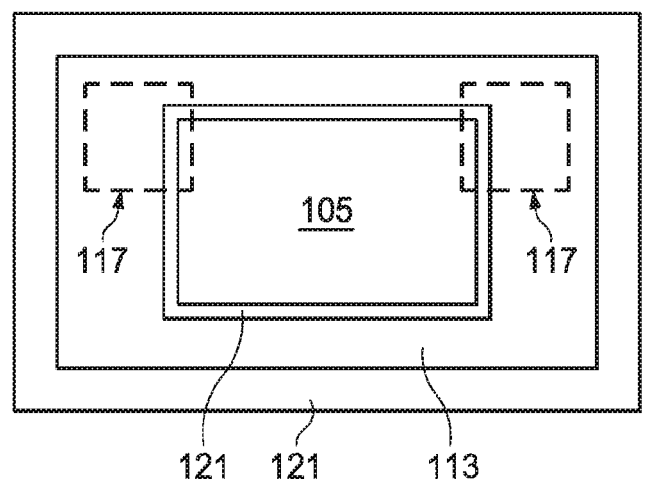
FIGS. 1A-14 are various views of an integrated circuit package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package structure with embedded heat dissipation features is provided in accordance with various embodiments in order to improve thermal performance by providing additional heat dissipation paths through the substrate side of the package. The variations of the embodiments are discussed. In what follows, like reference numerals refer to like elements.

Figure 1B:
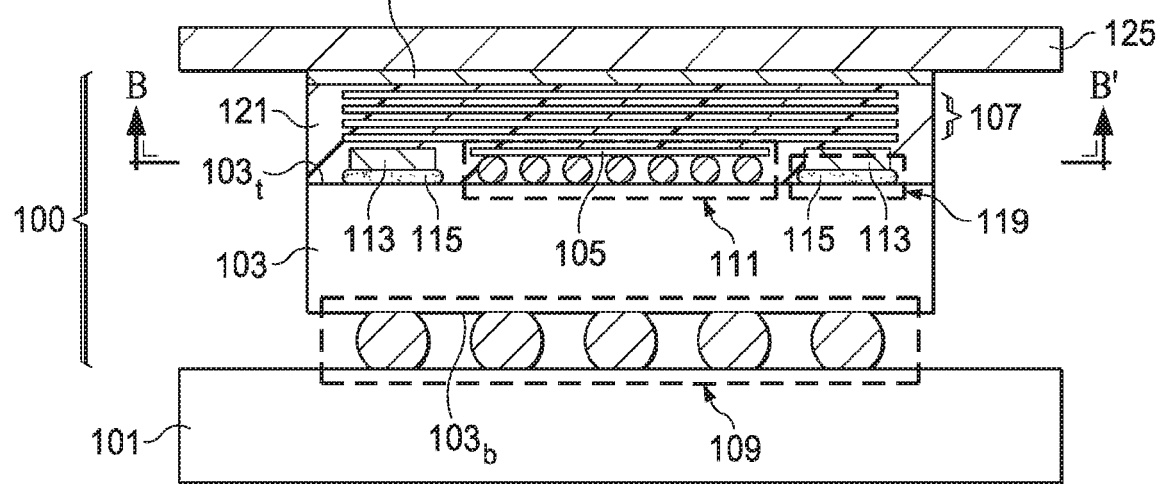

With reference to FIGS. 1A and 1B, there are shown top (through the line BB' in FIG. 1B) and cross-sectional views, respectively, of a first package 100 placed on a first substrate 101. The first substrate 101 may be fabricated from, for example, an organic (laminate) material such as bismaleimide-triazine (BT), a polymer-based material such as liquid-crystal polymer (LCP), a ceramic material such as low-temperature co-fired ceramic (LTCC), a silicon or glass interposer, an integrated circuit die, an integrated circuit package, or the like. In some embodiments, the first substrate 101 may be a printed circuit board (PCB). Referring further to FIG. 1B, a single package attached to the first substrate 101 is illustrated, which is provided as an example only. In other embodiment, multiple packages may be attached to the first substrate 101, and the first substrate 101 may provide electrical connection between different packages and between the packages and an external power source.

Referring further to FIGS. 1A and 1B, in some embodiments, the first package 100 may comprise a second substrate 103, a first chip 105, and a second chip 107 over and bonded to the first chip 105. The second substrate 103 may provide a structural base for the first package 100 and as well as provide an electrical interface from the first chip 105 and the second chip 107 to other packages, devices and systems (not shown) on the first substrate 101. For example, the second substrate 103 may comprise multiple conductive layers (not individually illustrated), some of which are inter-layers within the second substrate 103. These layers may be etched into traces of various widths and lengths and connected through inter-layer vias. Together, the lines and vias may form an electrical network to route power, ground, and signals from a top surface $103_t$ of the second substrate 103 to a bottom surface $103_b$ of the second substrate 103. The second substrate 103 may be fabricated from, for example, an organic (laminate) material such as bismaleimide-triazine (BT), a polymer-based material such as liquid-crystal polymer (LCP), a ceramic material such as low-temperature co-fired ceramic (LTCC), a silicon or glass interposer, or the like. The conductive layers and vias of the second substrate 103 may be formed from any suitable conductive material, such as copper, aluminum, silver, gold, other metals, alloys, combination thereof, and/or the like, and formed by any suitable technique, such as electro-chemical plating (ECP), electroless plating, other deposition methods such as sputtering, printing, and chemical vapor deposition (CVD) methods, or the like. In some embodiments, the conductive layers and vias are formed of copper (Cu) to a thickness between about 12 μm and about 75 μm.

In some embodiments, the second substrate 103 may include electrical elements, such as resistors, capacitors, signal redistribution circuitry, combinations of these, or the like. These electrical elements may be active, passive, or a combination thereof. In other embodiments, the second substrate 103 is free from both active and passive electrical elements therein. In some embodiments, the second substrate 103 may be an integrated fan-out (InFO) layer. All such combinations are fully intended to be included within the scope of the embodiments.

Referring further to FIG. 1B, in some embodiments, the second substrate 103 of the first package 100 is attached to the first substrate 101 using one or more connectors 109 formed on the bottom surface $103_b$ of the second substrate 103. The connectors 109 may comprise a conductive material such as solder, metal, or metal alloy, and may be utilized to facilitate electrical, physical, and thermal connectivity between the second substrate 103 and the first substrate 101. Additionally, the number and configuration of the connectors 109 illustrated in FIG. 1B, five evenly spaced connectors, is only for illustrative purpose. Any number and configuration of the connectors 109 may be employed to realize the desired electrical and thermal specifications of the first package 100. In some embodiments, the connectors 109 may comprise a ball grid array (BGA).

In some embodiments, the first package 100 may be a 3DIC structure in which the second chip 107 is stacked and bonded on top of the first chip 105 on the second substrate 103. The first chip 105 and the second chip 107 may be formed from a variety of semiconductor substrate materials such as silicon (Si), silicon carbide (SiC), gallium arsenide (GaAs), gallium nitride (GaN), or the like. A combination of active and/or passive devices, such as transistors, diodes, resistors, capacitors, and the like, may be formed as part of the first chip 105 and the second chip 107 to construct functional circuitries. In addition, alternating layers of conductive materials (such as copper, aluminum, alloys, doped polysilicon, combinations thereof, or the like) may be utilized between layers of dielectric materials to form interconnects between the active and passive devices and also to provide external connections between the active and passive devices and other external devices.

In some embodiments, the first chip 105 and the second chip 107 may be bonded using method such as direct bonding, chemically activated bonding, plasma activated bonding, anodic bonding, eutectic bonding, glass frit bonding, adhesive bonding, thermo-compressive bonding, reactive bonding, hybrid bonding and/or the like.

Additionally, the first chip 105 and the second chip 107 shown in FIGS. 1A and 1B are merely for illustrative purpose. Alternative embodiments may have a number of chips and/or chip stacks greater or smaller than the number illustrated (including a single chip) in order to meet desired functionalities and/or specifications. For example, in some embodiments, the second chip 107 may be a stack comprising one or more memory chips (illustrated by a stack of four chips in the FIG. 1B), and the first chip 105 may be a logic chip. Any suitable combination of chips may be utilized, and all such combinations are fully intended to be included within the scope of the embodiments.

The first chip 105 may be connected to a top surface $103_t$ of the second substrate 103, e.g., through flip-chip bonding using C4 bumps 111. The C4 bumps 111 provide electrical and thermal connections between the first chip 105 and the second substrate 103. However, alternative methods of electrically/thermally and physically attaching the first chip 105 to the second substrate 103, such as solder balls, microbumps, pillars, columns, or other structures formed from a conductive material such as solder, metal, or metal alloy, may be utilized to facilitate electrical, physical, and thermal connectivity between the first chip 105 and the second substrate 103. Additionally, a number and configuration of the C4 bumps 111 illustrated in FIG. 1B, seven evenly spaced connectors, is only for illustrative purpose. Any number of C4 bumps (or other types of connectors) in any configuration may also be employed. In some embodiments, the C4 bumps 111 are formed having a size between about 60 μm and about 100 μm, and a pitch between about 80 μm and about 200 μm.

In some embodiments, an underfill material (not shown) may be deposited to fill empty spaces between the first chip 105 and the second substrate 103, and between the C4 bumps 111. The underfill material may comprise different epoxies with dielectric properties, or the like. A cure may be performed after depositing the underfill material. The underfill material increases mechanical reliability by distributing stresses across the top surface $103_t$ of the second substrate 103 rather than allowing them to become concentrated in the C4 bumps 111. In addition, the underfill material provides encapsulation from moisture and contaminants in the external environment.

In some embodiments, an embedded heat dissipation feature (eHDF) 113 may be attached to the top surface $103_t$ of the second substrate 103 below the second chip 107 and surrounding the first chip 105 using a high thermal conductivity adhesive 115. The eHDF 113 is embedded in the first package 100 to provide additional heat dissipation pathways from the first chip 105 and the second chip 107. For example, heat may flow from the first chip 105 and the second chip 107 to the second substrate 103 through the eHDF 113, and subsequently to the connectors 109 and a heat sink (not shown) on the first substrate 101. In some embodiments, the eHDF 113 may be placed below and/or above potential hot spot areas, for example, below a first plurality of logic cores 117 of the second chip 107 as illustrated in FIGS. 1A and 1B. The eHDF 113 may comprise a suitable material having a high thermal conductivity, such as Cu, Al, NiCo, AlSiC, alloys thereof, combination thereof, and/or the like. The eHDF 113 may also comprise a graphite sheet, a nanosheet based composite, a dummy silicon bar, one or more silicon blocks, and/or the like. The high thermal conductivity adhesive 115 may comprise a thermal interface material, a suitable solder material, silver paste, and/or the like. The particular shape of the eHDF 113, a planar rectangular sheet with a rectangular void in the middle as depicted in the FIGS. 1A and 1B, is for illustrative purposes only and other geometries may be used according to thermal management specifications of the first package 100. In an embodiment, the eHDF 113 may be formed to have a thickness between about 0.5 mm and about 2 mm, and high thermal conductivity adhesive 115 may be formed to have a thickness between about 50 µm and about 100 µm.

Figure 2:
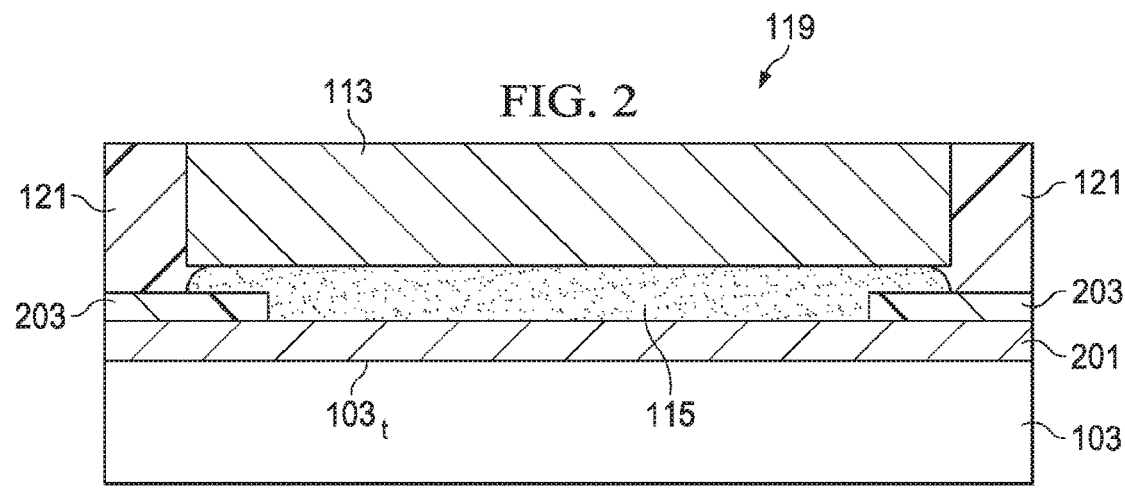

In some embodiments, the eHDF 113 may be attached to a top dielectric layer (not shown) of the second substrate 103. In other embodiments, the eHDF 113 may be attached to exposed power/ground layers of the second substrate 103. For example, FIG. 2 illustrates a detailed view of an interface 119 between the eHDF 113 and the second substrate 103. The eHDF 113 is attached to a power/ground layer 201 exposed through a patterned solder resist layer 203 using the high thermal conductivity adhesive 115. In some embodiments, the patterned solder resist layer 203 may comprise a Hitachi solder resist material, or similar. In an embodiment, the patterned solder resist layer 203 may be formed to have a thickness between about 20 µm and about 25 µm.

Referring further to FIGS. 1A, 1B, and 2, a mold 121, such as silica filled epoxy resin, or the like, may be used to fill in the gap space between the first chip 105, the second chip 107, the eHDF 113, and the second substrate 103. In some embodiments, the mold 121 provides encapsulation of components of the first package 100 from moisture and contaminants in the external environment.

In some embodiments, the second chip 107 may be optionally brought to a contact with a cooling plate 125 through using a thermal interface material (TIM) layer 123 as illustrated in FIG. 1B. In an embodiment, the cooling plate 125 may be a part of a structural frame and/or housing of a device comprising the first package 100 and may comprise a suitable material with high thermal conductivity. The TIM layer 123 may be a viscous, silicone compound similar to the mechanical properties of a grease or a gel, a polymer material, a metal, or the like. The TIM layer 123 is used to improve electrical and/or thermal connection by filling in microscopic air pockets created between minutely uneven surfaces, such as a region between a top surface of the second chip 107 and the cooling plate 125. In an embodiment, the TIM layer 123 may be formed to a thickness between about 50 µm and about 100 µm.

Figure 3A:
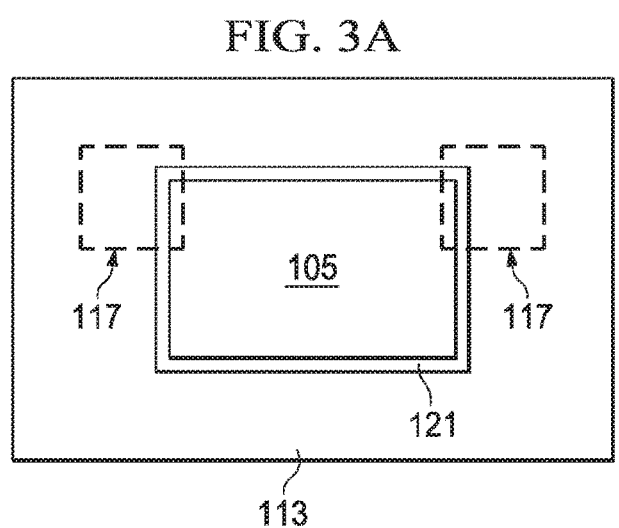
Figure 3B:
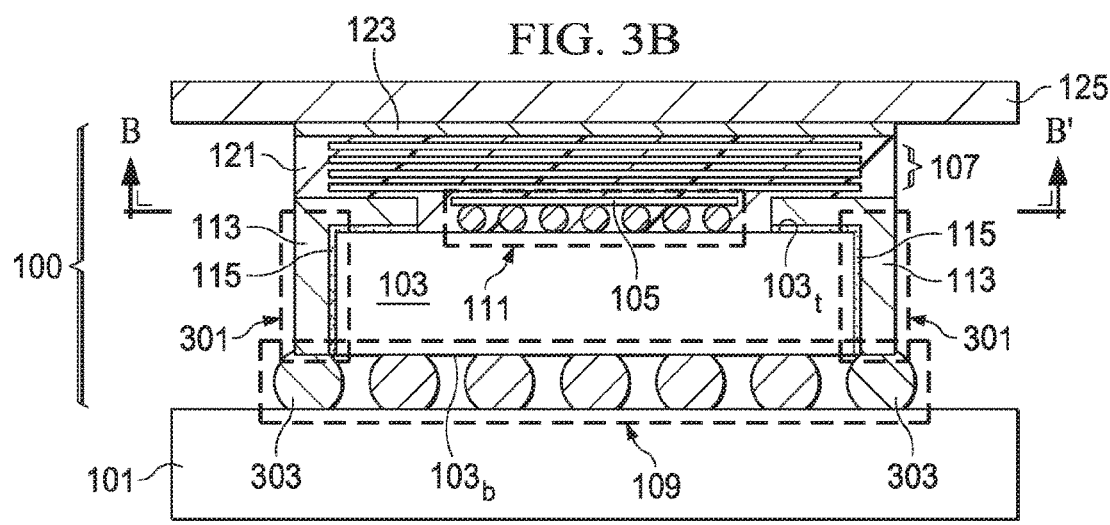

Referring to FIGS. 3A and 3B, the eHDF 113 may have an extension 301 surrounding the second substrate 103. In some embodiments, the eHDF 113 may be directly connected to the first substrate 101 using thermal connectors 303 of the connectors 109. The thermal connectors 303 may be dummy connectors in the sense that they may not provide electrical connection between the first package 100 and the first substrate 101, while providing good thermal connection between the eHDF 113 and the first substrate 101. The thermal connectors 303 may comprise any suitable material with high thermal conductivity and may be used to provide thermal connection between the eHDF 113 and the first substrate 101. In some embodiments, the eHDF 113 may be attached to a top dielectric layer of the second substrate 103, which may not provide good thermal connection between the eHDF 113 and the first substrate 101, and the thermal connectors 303 may be employed to provide a path of high thermal conductivity between the eHDF 113 and the first substrate 101. The number and configuration of the thermal connectors 303 illustrated in FIG. 3B is for illustrative purposes only, and other configuration may be used depending on a design of the eHDF 113. In other embodiments, solder bars (not shown), or other thermal features may be used to attach the eHDF 113 to the first substrate 101.

Figure 4A:
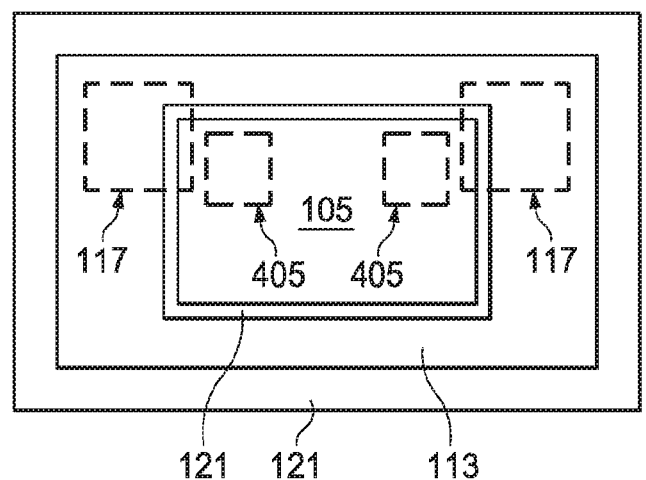
Figure 4B:
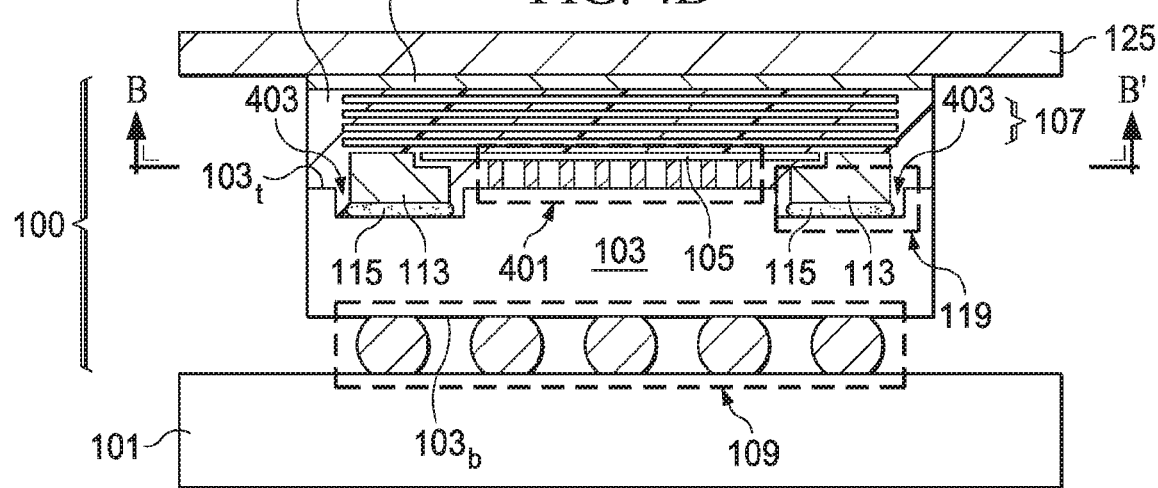

Referring to FIGS. 4A and 4B, the first chip 105 is connected to a top surface $103_t$ of the second substrate 103, through flip-chip bonding using Cu pillars 401 in accordance to some embodiments. In some embodiments, the second substrate 103 may be patterned to form one or more trenches 403. The eHDF 113 may be placed in the trenches 403 and attached to the second substrate 103 using the high thermal conductivity adhesive 115. The eHDF 113 may have a shape to provide heat dissipation to more potential hot spots of the first chip 105 and the second chip 107 compared to the embodiment described above with reference to FIGS. 1A and 1B. In some embodiments, the eHDF 113 may provide heat dissipation to the first plurality of logic cores 117 in the top chip 107 as well as to a second plurality of logic cores 405 in the first chip 105. In some embodiments, the eHDF 113 may be attached to a top dielectric layer of the second substrate 103 using the high thermal conductivity adhesive 115. In other embodiments, the eHDF 113 may be attached to exposed power/ground layers of the second substrate 103 as discussed above with reference to FIG. 2.

Figure 5A:
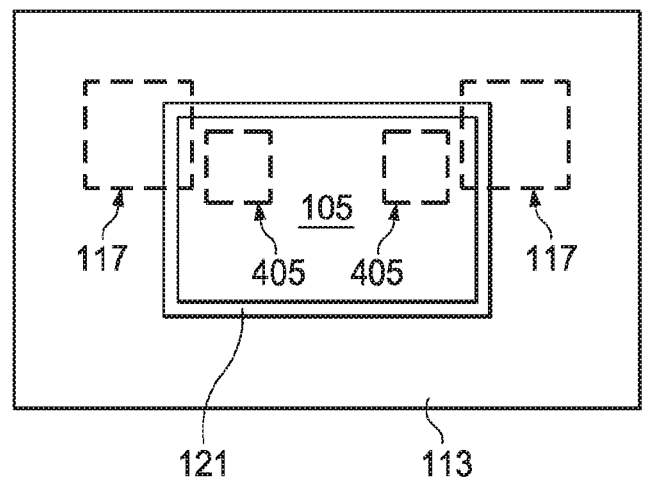
Figure 5B:
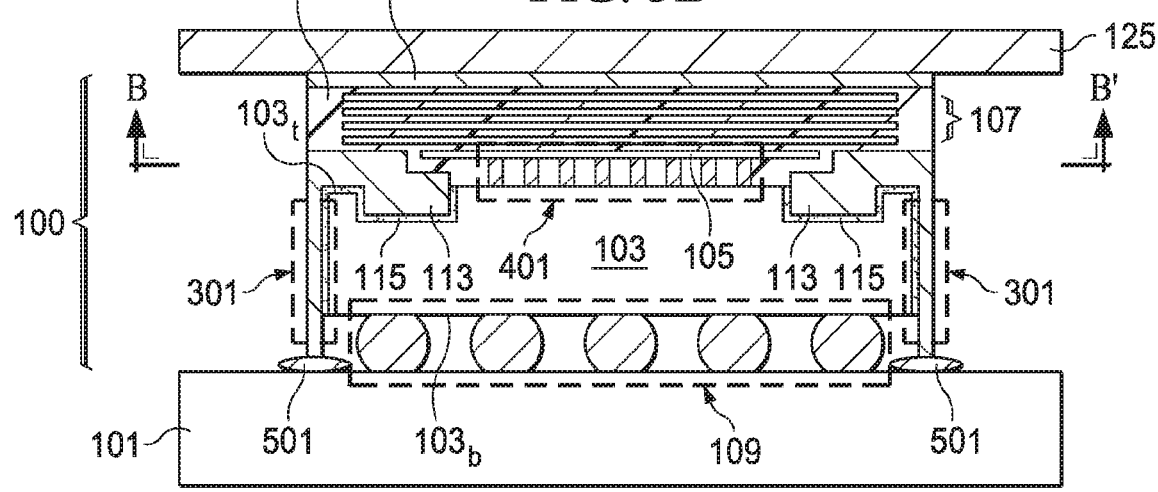

Referring to FIGS. 5A and 5B, an embodiment similar to the one described with reference to FIGS. 4A and 4B is illustrated. In some embodiments, the eHDF 113 may have the extension 301 surrounding the second substrate 103. The extension 301 may extend below the bottom surface $103_b$ of the second substrate 103 and may be directly connected to the first substrate 101, for example, using solder bars 501.

Figure 6A:
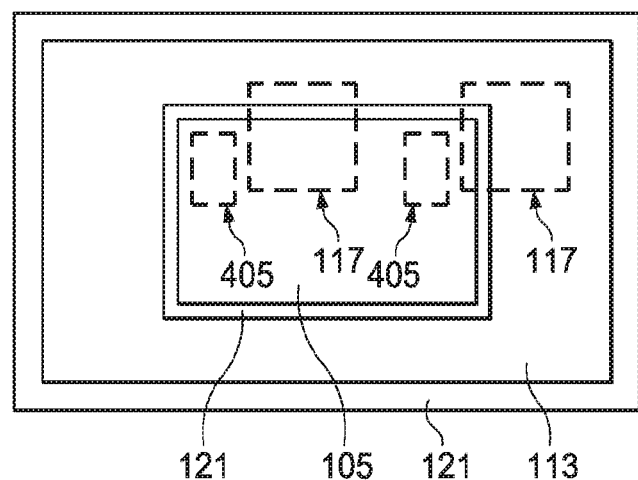
Figure 6B:
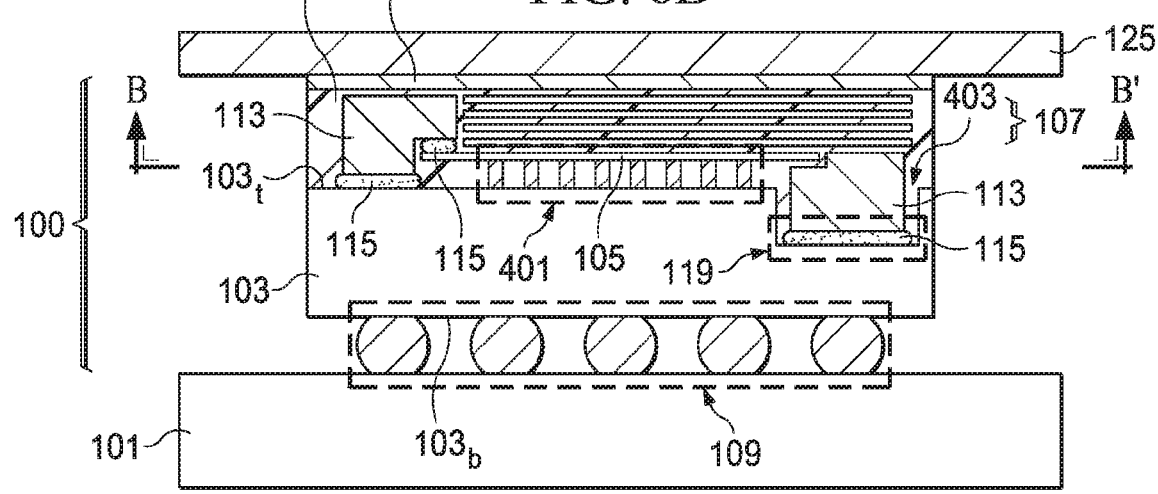

Referring to FIGS. 6A and 6B, the first chip 105 and the second chip 107 may be bonded asymmetrically to each other in accordance to some embodiments. To accommodate the asymmetry between the first chip 105 and the second chip 107 the eHDF 113 may be formed to have a non-planar shape and may comprise one or more portions physically disconnected from each other, while being in thermal contact. In some embodiments, a first portion of the eHDF 113 may be placed in one of the trenches 403 in the substrate and may be attached to the second substrate 103 using the high thermal conductivity adhesive 115. A second portion of the eHDF 113 may be attached to the top surface $103_t$ of the second substrate 103 and to a top surface of the first chip 105 using the high thermal conductivity adhesive 115. In some embodiments, the eHDF 113 may be attached to a top dielectric layer of the second substrate 103. In other embodiments, the eHDF 113 may be attached to power/ground layers of the substrate 103 as discussed above with reference to FIG. 2.

Figure 7A:
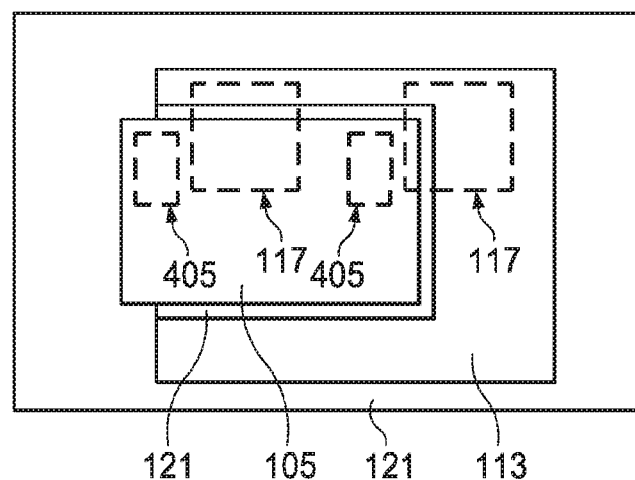
Figure 7B:
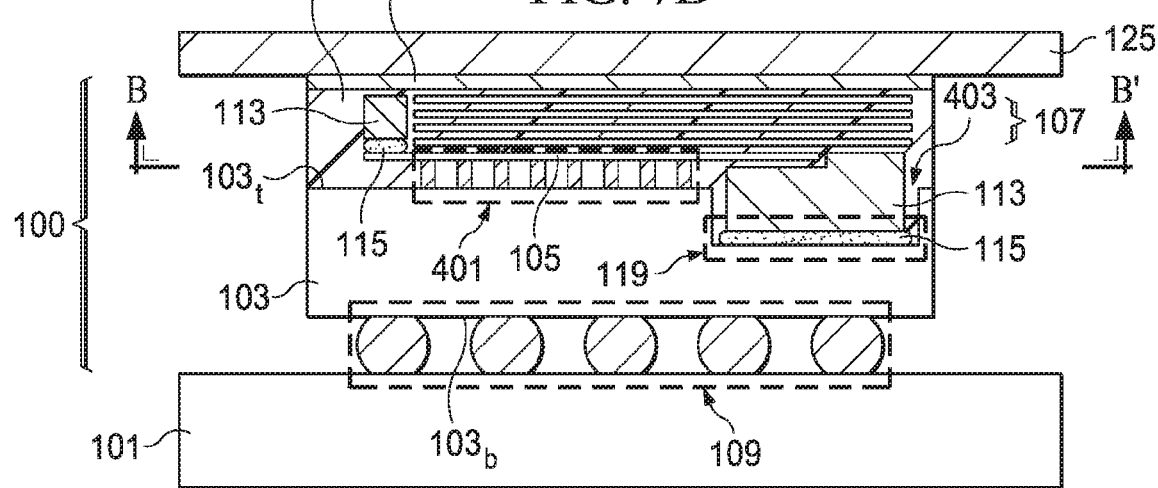

Referring to FIGS. 7A and 7B, an embodiment similar to the one described with reference to FIGS. 6A and 6B is illustrated. In the embodiment, a first portion of the eHDF 113 may be placed in one of the trenches 403 in the second substrate 103 and may be attached to the second substrate 103 using the high thermal conductivity adhesive 115. In some embodiments, the first portion the eHDF 113 may be attached to a top dielectric layer of the second substrate 103. In other embodiments, the first portion of the eHDF 113 may be attached to power/ground layers of the substrate 103 as discussed above with reference to FIG. 2. A second portion of the eHDF 113 may be attached to a top surface of the first chip 105 using the high thermal conductivity adhesive 115.

In some embodiments, the second portion of the eHDF 113 may comprise a silicon bar, a silicon block, and/or the like, and may be formed during a chip bonding process described above with reference to FIG. 1.

Figure 8:
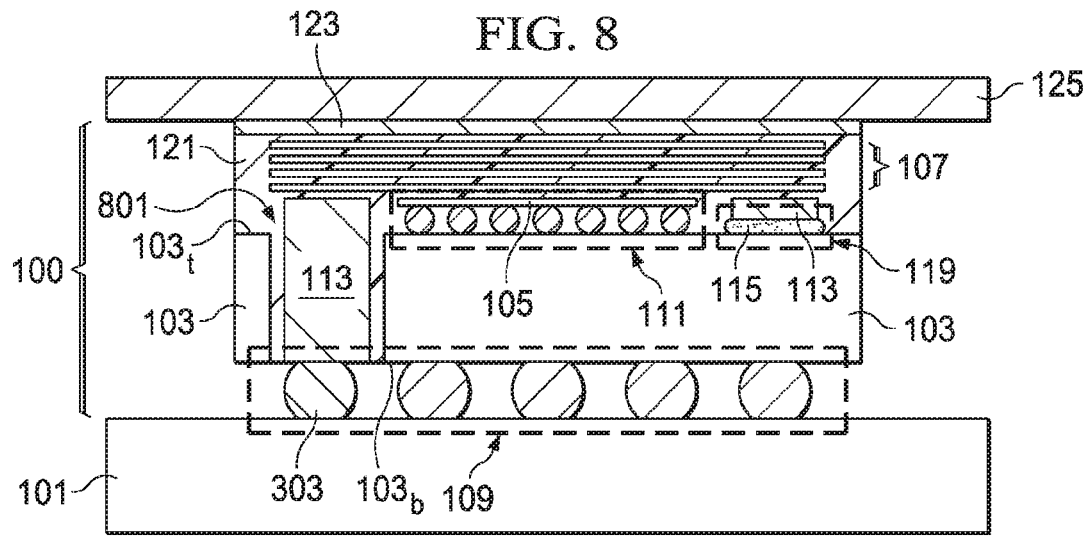

Referring to FIG. 8, an embodiment similar to the one described with reference to FIGS. 1A and 1B is illustrated. In the embodiment, a hole 801 may be formed in the second substrate 103 directly below potential hot spots, such as the first plurality of logic cores 117 in the second chip 107 (see, for example, FIG. 1A). In the embodiment, a first portion of the eHDF 113 may be attached the top surface $103_t$ of the second substrate 103 using the high thermal conductivity adhesive 115. A second portion of the eHDF 113 may extend through the hole 801 and may be directly attached to the thermal connectors 303 of the connectors 109 using, for example, a solder reflow process. The second portion of the eHDF 113 in the hole 801 of the second substrate 103 may provide a direct heat dissipation path from the second chip 107 to the first substrate 101 bypassing the second substrate 103. In some embodiments, the first portion the eHDF 113 may be attached to a top dielectric layer of the second substrate 103. In other embodiments, the first portion of the eHDF 113 may be attached to power/ground layers of the substrate 103 as discussed above with reference to FIG. 2.

Figure 9:
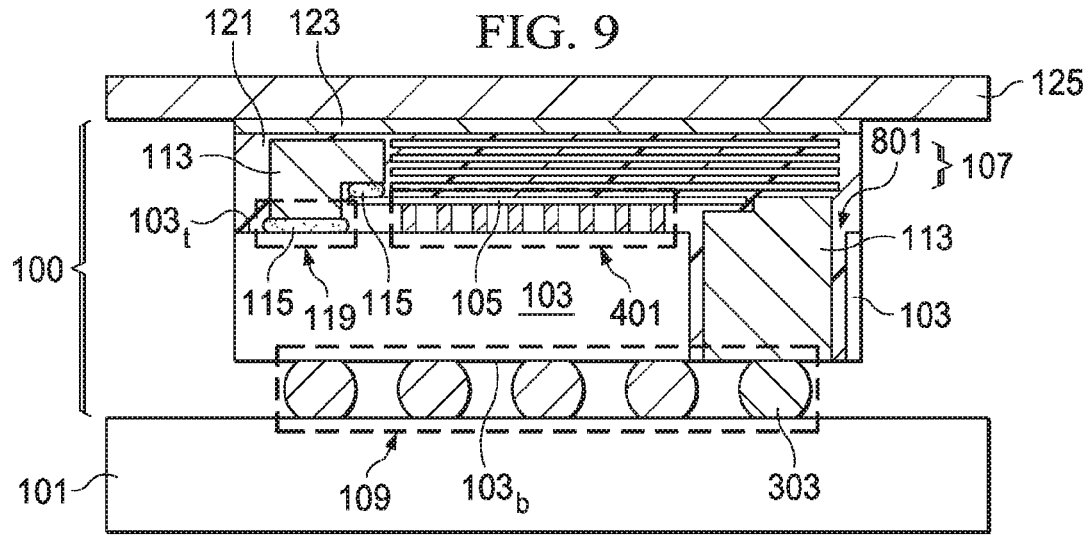

Referring to FIG. 9, an embodiment similar to the one described with reference to FIGS. 6A and 6B is illustrated. In the embodiment, a hole 801 may be formed in the second substrate 103 directly below potential hot spots, such as the first plurality of logic cores 117 and the second plurality of logic cores 405 in the second chip 107 and the first chip 105, respectively (see, for example, FIG. 4A). In some embodiments, a first portion of the eHDF 113 may extend through the hole 801 and may be directly attached to the thermal connectors 303 of the connectors 109 using, for example, a solder reflow process. A second portion of the eHDF 113 may be attached to the top surface $103_t$ of the second substrate 103 and to a top surface of the first chip 105 using the high thermal conductivity adhesive 115. The portion of the eHDF 113 in the hole 801 of the second substrate 103 may provide a direct heat dissipation path from the first chip 105 and the second chip 107 to the first substrate 101 bypassing the second substrate 103. In some embodiments, the first portion the eHDF 113 may be attached to a top dielectric layer of the second substrate 103. In other embodiments, the first portion of the eHDF 113 may be attached to power/ground layers of the substrate 103 as discussed above with reference to FIG. 2.

Figure 10A:
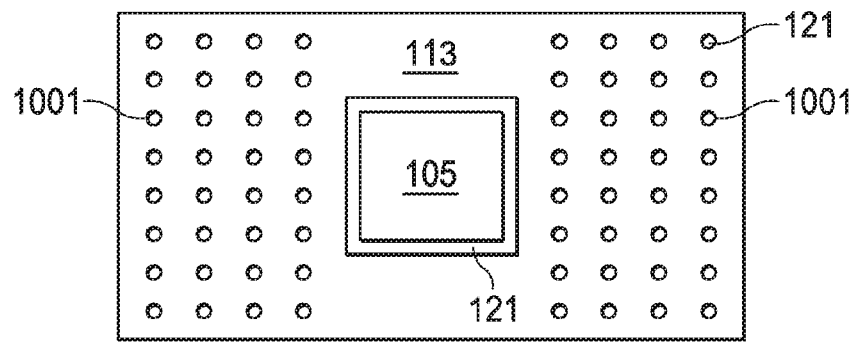
Figure 10B:
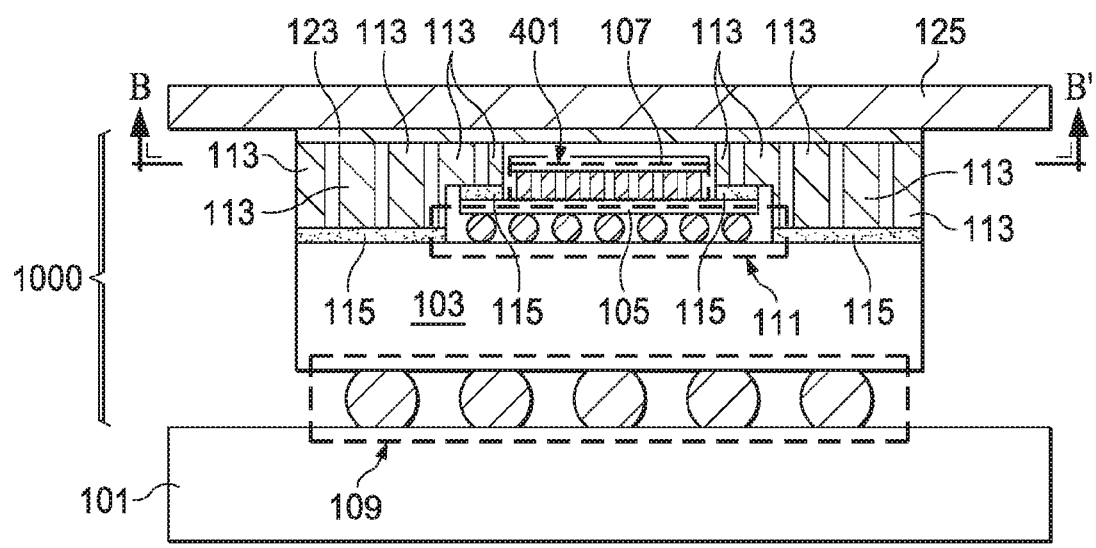

Referring to FIGS. 10A and 10B, a second package 1000 placed on the first substrate 101 is illustrated in accordance with some embodiments. The second package 1000 may comprise the first chip 105 and the second chip 107, the first chip 105 having a larger footprint than the second chip 107. The eHDF 113 may be formed to have perforations, such as plurality of holes 1001, to control warping and induced thermal mechanical stress of the second package 1000 without compromising thermal characteristics of the eHDF 113. In some embodiments, the eHDF 113 may surround the first chip 105 and the second chip 107, and may be sandwiched between the second substrate 103 and the cooling plate 125. The eHDF 113 may provide a first dissipation pathway from the first chip 105 and the second chip 107 to the cooling plate 125, and a second dissipation pathway from the first chip 105 and the second chip 107 to the second substrate 103.

Figure 11:
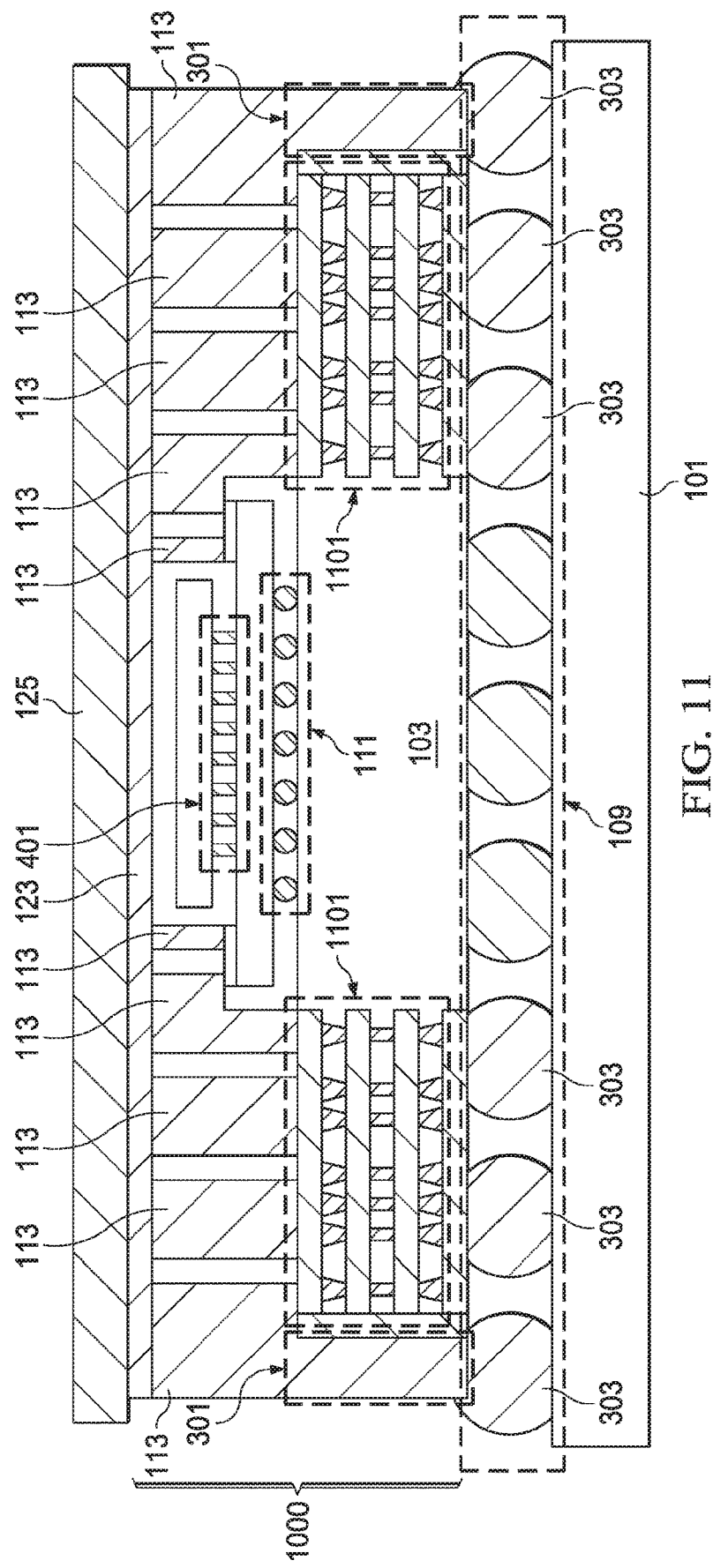

Referring to FIG. 11, an embodiment similar to the one described with reference to FIGS. 10A and 10B is illustrated. The eHDF 113 may have the extension 301 surrounding the second substrate 103. The extension 301 of the eHDF 113 may be directly connected to the first substrate 101 using, for example, the thermal connectors 303 of the connectors 109. In addition, the second substrate 103 may have a thermal interconnects 1101 in an area free from attached chips and below the eHDF 113. The thermal interconnects 1101 may comprise thermal layers and vias and may provide thermal pathways between the eHDF 113 and the first substrate 101. In some embodiments, the thermal interconnects 1101 may be dummy interconnects in a sense that they may not provide electrical connection between the first chip 105, the second chip 107 and the first substrate 101. In other embodiments, the extension 301 in the eHDF 113 and the thermal interconnects 1101 in the substrate may not be present at the same time.

Figure 12:
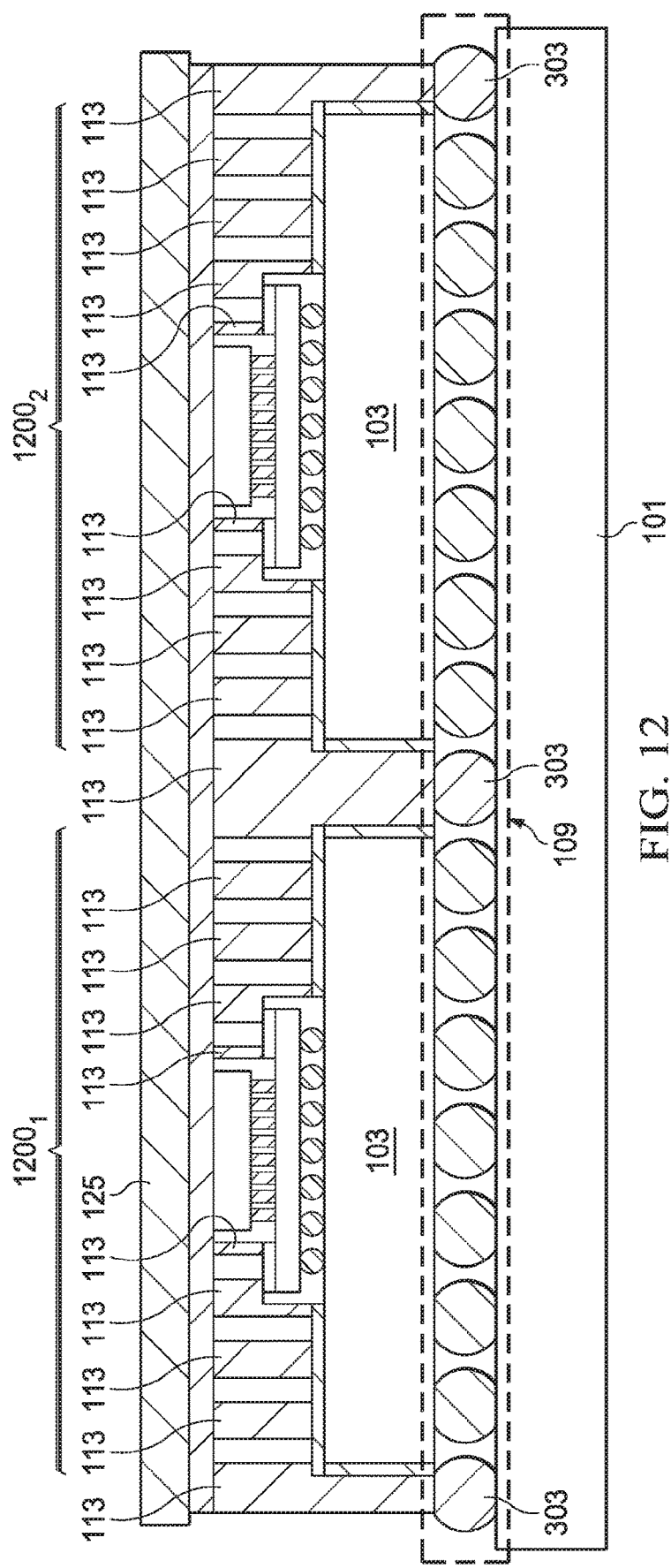

Referring to FIG. 12, a first known good package (KGP) $1200_1$ and a second KGP $1200_2$ may be attached side by side to the first substrate 101 in accordance to some embodiments. In some embodiments, the first KGP $1200_1$ and the second KGP $1200_2$ may be similar to the second package 1000 described above with respect to FIGS. 10A and 10B. In other embodiments, the first KGP $1200_1$ and the second KGP $1200_2$ may be different packages. In some embodiments, the eHDF 113 may be an integral feature that provides additional thermal dissipation pathways from the first KGP $1200_1$ and the second KGP $1200_2$ to the second substrate 103 and the first substrate 101. The eHDF 113 may be sandwiched between the second substrate 103 and the cooling plate 125 and attached to the second substrate 103 using thermal connectors 303 of the connectors 109. The eHDF 113 may provide a first dissipation pathway from the first KGP $1200_1$ and the second KGP $1200_2$ to the cooling plate 125, and a second dissipation pathway from the first KGP $1200_1$ and the second KGP $1200_2$ to the second substrate 103 and the first substrate 101.

Figure 13A:
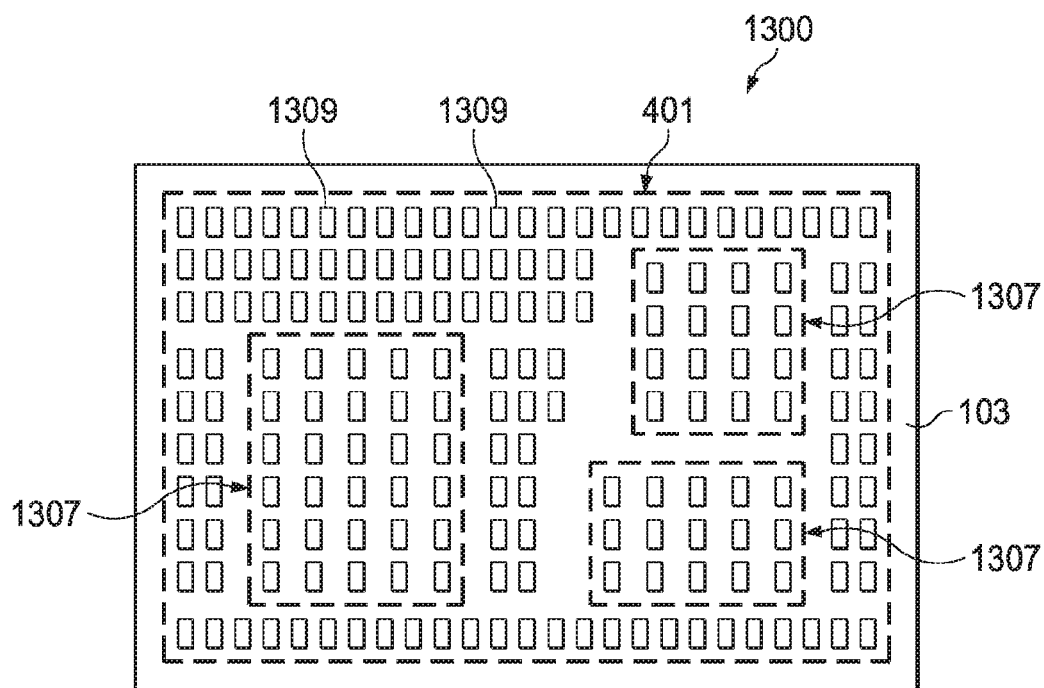
Figure 13B:
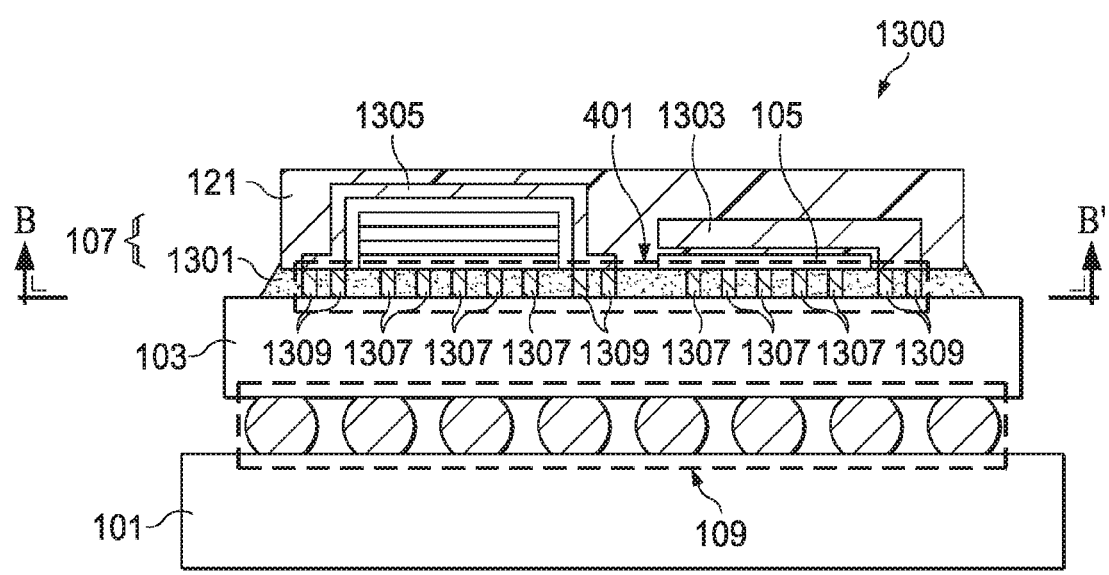

Referring to FIGS. 13A and 13B, a third package 1300 placed on the first substrate 101 is illustrated. The third package 1300 may comprise a first chip 105 and the second chip 107 attached to the second substrate 103 side by side, for example, through flip-chip bonding using the Cu pillars 401. In some embodiments, an underfill material 1301 may be deposited to fill empty spaces between the first chip 105, the second chip 107 and the second substrate 103, and between the Cu pillars 401. The underfill material 1301 may comprise different epoxies with dielectric properties, or the like. A cure may be performed after depositing the underfill material 1301. In some embodiments, the first chip 105 may have a first eHDF 1303 and the second chip 107 may have a second eHDF 1305. The first eHDF 1303 and the second eHDF 1305 may have different shapes depending on shapes of the first chip 105 and the second chip 107. In some embodiments, the first chip 105 and the second chip 107 are attached to the second substrate 103 using electrically active Cu pillars 1307, while the first eHDF 1303 and the second eHDF 1305 are attached to the second substrate 103 using thermal Cu pillars 1309. The mold 121 may be used to fill in the gap space between the first chip 105, the second chip 107, the first eHDF 1303, the second eHDF 1305, and the second substrate 103. In some embodiments, the mold 121 provides encapsulation of components of the third package 1300 from moisture and contaminants in the external environment.

Figure 14:
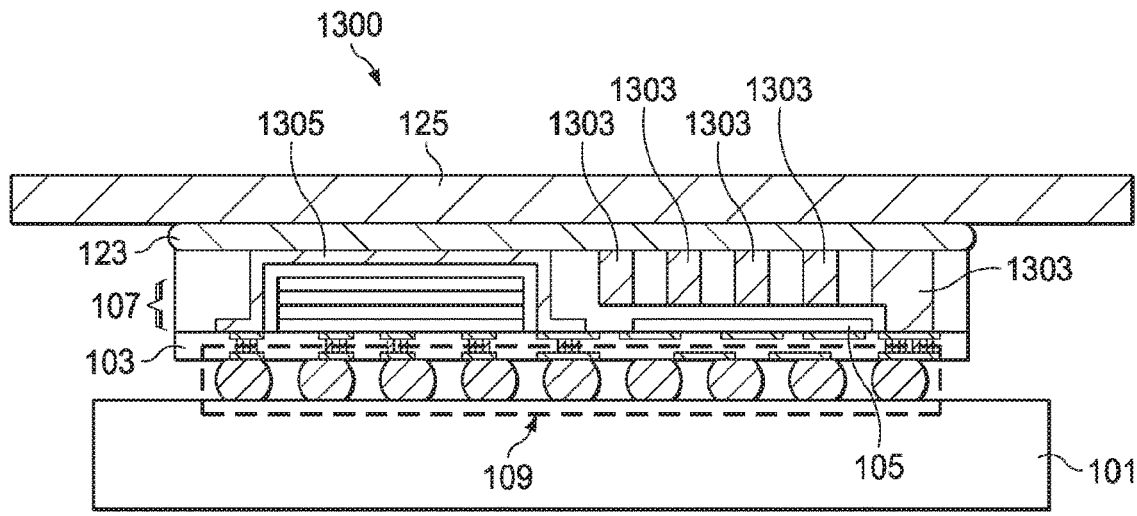

Referring to FIG. 14, an embodiment similar to the one described above with reference to FIGS. 13A and 13B is illustrated. In some embodiments, the second substrate 103 of the third package 1300 may be an InFO layer. The InFO layer may be used to redistribute short-pitched contacts in the first chip 105 and the second chip 107 to long-pitched contacts, such as the connectors 109 that are suitable to attach the third package 1300 to the first substrate 101. In an embodiment, the first eHDF 1303 may have a perforated structure as illustrated in FIG. 14. In some embodiments, the first eHDF 1303 and the second eHDF 1305 may be optionally brought to a contact with the cooling plate 125 through using the thermal interface material (TIM) layer 123. The cooling plate 125 may be a part of a structural frame and/or housing of a device comprising the third package 1300. In some embodiments, the cooling plate 125 may be formed using any material with suitable mechanical and thermal properties.

Figure 15A:
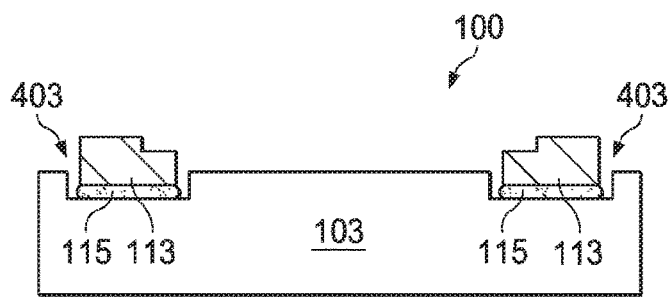
FIGS. 15A-15C are cross-sectional views illustrating a method of forming an integrated circuit package in accordance with some embodiments.
Figure 15B:
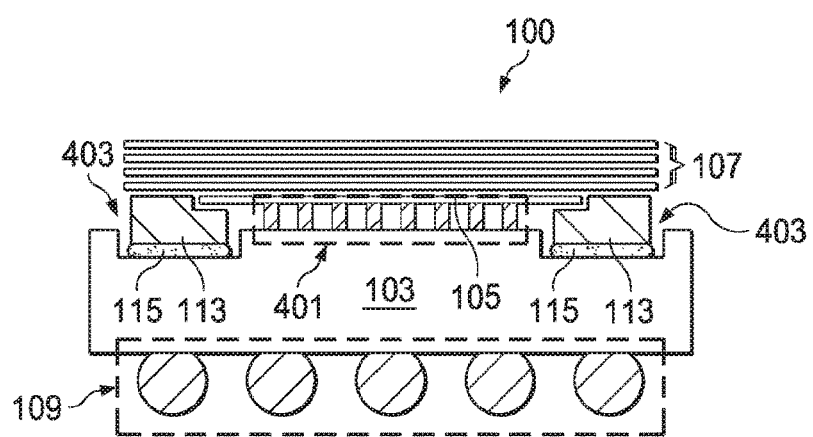
Figure 15C:
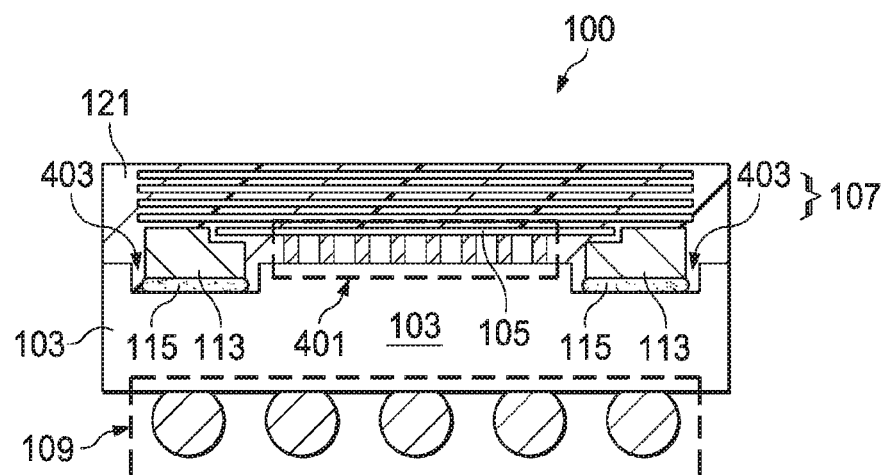

FIGS. 15A-15C are cross-sectional views illustrating a method of forming an integrated circuit package, for example, such as the first package 100 described above with reference to FIGS. 4A and 4B, in accordance with some embodiments. The method described below may be also applied to other embodiments described above. Referring to FIG. 15A, the second substrate 103 may be optionally patterned to form one or more trenches 403. The eHDF 113 may be placed in the trenches 403 and attached to the second substrate 103 using the high thermal conductivity adhesive 115. Referring to FIG. 15B, in some embodiments, the first chip 105 and the second chip 107 may be bonded using methods such as direct bonding, chemically activated bonding, plasma activated bonding, anodic bonding, eutectic bonding, glass frit bonding, adhesive bonding, thermocompressive bonding, reactive bonding, hybrid bonding and/or the like. The bonded chips are attached to the second substrate 103, for example, through flip-chip bonding using Cu pillars 401 in accordance to some embodiments. The eHDF 113 may have a shape to provide heat dissipation to more potential hot spots of the first chip 105 and the second chip 107 as described, for example, with reference to FIGS. 4A and 4B.

Referring to FIG. 15C, a mold 121, such as silica filled epoxy resin, or the like, may be used to fill in the gap space the first chip 105, the second chip 107, the eHDF 113, and the second substrate 103. In some embodiments, the mold 121 provides encapsulation of the first package 100 from moisture and contaminants in the external environment. The second substrate 103, as illustrated in FIGS. 15A-15C, is represented as a single substrate having a similar size as the first package 100. However, persons skilled in the art should also realize that the second substrate 103 may be of a panel type. Plurality of bonded chips may be attached to the panel substrate and subsequently singulated into individual packages, such as the first package 100.

Figure 16A:
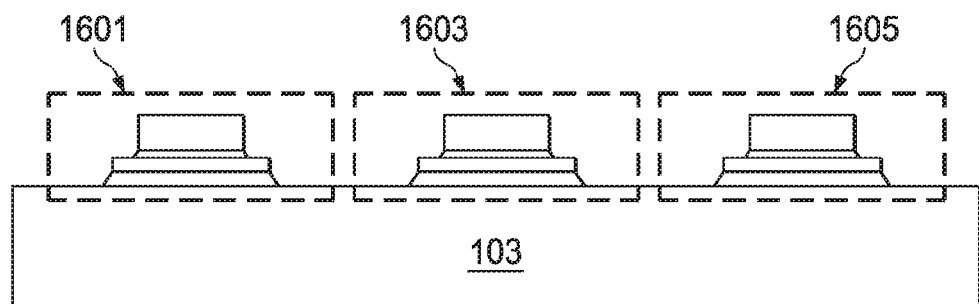
FIGS. 16A-16C are cross-sectional views illustrating a method of forming an integrated circuit package in accordance with some embodiments.
Figure 16B:
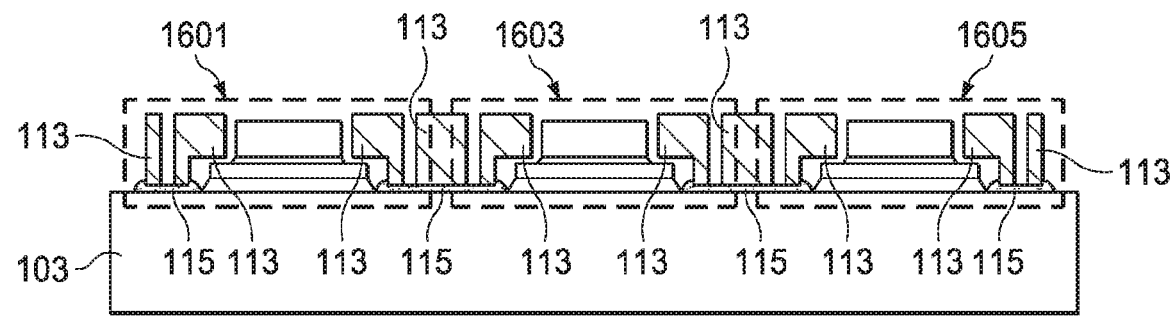
Figure 16C:
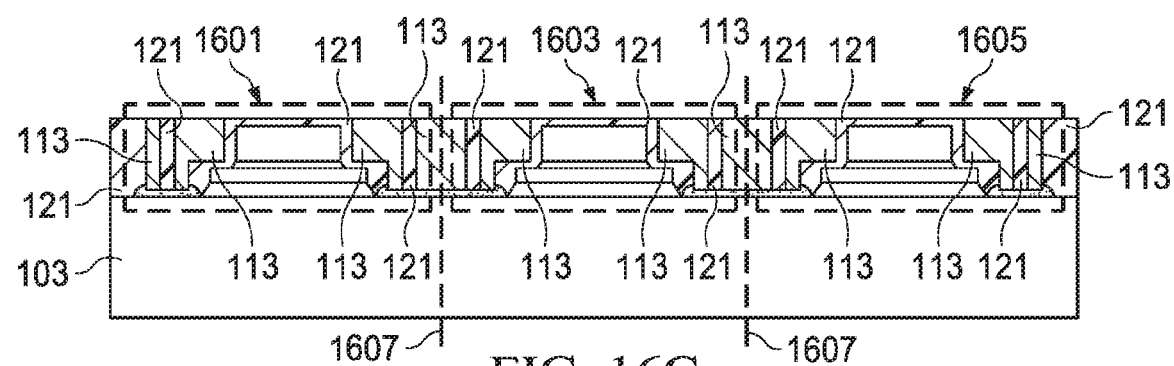

FIGS. 16A-16C are cross-sectional views illustrating a method of forming an integrated circuit package, for example, such as the second package 1000 described above with reference to FIGS. 10A and 10B, in accordance with some embodiments. The method described below may be also applied to other embodiments described above. Referring to FIG. 16A, the second substrate 103 may be a panel substrate which will be subsequently singulated into individual packages. In some embodiments, a first plurality of bonded chips 1601, a second plurality of bonded chips 1603, and a third plurality of bonded chips 1605 are attached to the second substrate 103, for example, through flip-chip bonding in accordance to some embodiments. Referring to FIG. 16B, the eHDF 113 may be a panel type and may be attached to the second substrate 103 using the high thermal conductivity adhesive 115. In some embodiments, the eHDF 113 may have perforations as described above, for example, with reference to FIG. 10A. The eHDF 113 may provide heat dissipation pathway from the first plurality of bonded chips 1601, the second plurality of bonded chips 1603, and the third plurality of bonded chips 1605 to the second substrate 103.

Referring to FIG. 16C, a mold 121, such as silica filled epoxy resin, or the like, may be used to fill in the gap space between the first plurality of bonded chips 1601, the second plurality of bonded chips 1603, the third plurality of bonded chips 1605, the eHDF 113, and the second substrate 103. In some embodiments, the mold 121 provides encapsulation of the packages from moisture and contaminants in the external environment. Subsequently the second substrate 103 is diced along scribe lines 1607 between neighboring bonded chips, such as the first plurality of bonded chips 1601 and the second plurality of bonded chips 1603, into individual packages, such as the second package 1000.

In an embodiment, an integrated circuit package comprises a substrate, one or more chips over the substrate, and an embedded heat dissipation feature (eHDF) between the substrate and at least one of the chips.

In another embodiment, an integrated circuit package comprises a substrate, a first chip over the substrate, and a second chip over the first chip, the second chip having a first region and a second region, the first region being an area that exhibits a higher temperature than the second region during use. The an integrated circuit package further comprises an embedded heat dissipation feature (eHDF) over the substrate, the first region of the second chip being over and in thermal contact with at least a portion of the eHDF.

In yet another embodiment, a method of fabricating an integrated circuit package, the method comprises providing a substrate, placing an embedded heat dissipation feature (eHDF) over the substrate, and attaching a stack of chips on the substrate, at least one of the chips being placed over the eHDF.

In yet another embodiment, an integrated circuit package includes a substrate and an embedded heat dissipation feature (eHDF) over the substrate. A first portion of the eHDF extends into the substrate. The integrated circuit package further includes a first chip over the substrate. The eHDF extends along at least two sidewalls of the first chip. A bottommost surface of the first chip is below a topmost surface of the first portion of the eHDF. The integrated circuit package further includes a second chip over the first chip. A bottommost surface of the second chip is above the topmost surface of the first portion of the eHDF.

In yet another embodiment, an integrated circuit package includes a substrate and an embedded heat dissipation feature (eHDF) over the substrate. A first portion of the eHDF extends through the substrate. A second portion of the eHDF extends along a topmost surface of the substrate. A topmost surface of the first portion of the eHDF is above the topmost surface of the substrate. A bottommost surface of the eHDF is level with a bottommost surface of the substrate. The integrated circuit package further includes a first chip bonded to the topmost surface of the substrate. A bottommost surface of the first chip is below the topmost surface of the first portion of the eHDF. The integrated circuit package further includes a second chip over and electrically coupled to the first chip. A bottommost surface of the second chip is above the topmost surface of the first portion of the eHDF.

In yet another embodiment, an integrated circuit package includes a substrate and an embedded heat dissipation feature (eHDF) over the substrate. The eHDF extends along a topmost surface and sidewalls of the substrate. The integrated circuit package further includes a first chip bonded to the topmost surface of the substrate. A bottommost surface of the first chip is below the topmost surface of the eHDF. The integrated circuit package further includes a second chip over the first chip. A bottommost surface of the second chip is above the topmost surface of the eHDF.

In yet another embodiment, an integrated circuit package includes a substrate having a top surface and a bottom surface opposite to the top surface, and a hole in the substrate. The hole extends from the top surface of the substrate to the bottom surface of the substrate. The integrated circuit package further includes an embedded heat dissipation feature (eHDF), a first chip over the top surface of the substrate, and a second chip over the first chip. The eHDF includes a first portion within the hole and a second portion over the substrate. A sidewall of the first chip faces a sidewall of the first portion of the eHDF. The second chip extends along a top surface of the first portion of the eHDF.

In yet another embodiment, an integrated circuit package includes a substrate, a hole extending through the substrate, and an embedded heat dissipation feature (eHDF). The eHDF includes a first portion extending through the hole and a second portion extending over the substrate. The integrated circuit package further includes a first chip attached to the substrate and an encapsulant extending along sidewalls of the first chip. The first chip is interposed between the first portion of the eHDF and the second portion of the eHDF. A portion of the encapsulant extends through the hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit package comprising:
    a substrate;
    an embedded heat dissipation feature (eHDF) over the substrate, a first portion of the eHDF extending through the substrate, a second portion of the eHDF extending along a topmost surface of the substrate, a topmost surface of the first portion of the eHDF being above the topmost surface of the substrate, a bottommost surface of the eHDF being level with a bottommost surface of the substrate;
    a first chip bonded to the topmost surface of the substrate, a bottommost surface of the first chip being below the topmost surface of the first portion of the eHDF; and
    a second chip over and electrically coupled to the first chip, a bottommost surface of the second chip being above and facing the topmost surface of the first portion of the eHDF.

2. The integrated circuit package of claim 1, further comprising a connector thermally coupled to the bottommost surface of the first portion of the eHDF.

3. The integrated circuit package of claim 1, further comprising a high thermal conductivity adhesive between the second portion of the eHDF and the topmost surface of the substrate.

4. The integrated circuit package of claim 1, further comprising an encapsulant surrounding the first chip and the second chip, a portion of the encapsulant being interposed between a sidewall of the substrate and a sidewall of the first portion of the eHDF.

5. The integrated circuit package of claim 1, wherein a topmost surface of the second chip is below a topmost surface of the second portion of the eHDF.

6. The integrated circuit package of claim 1, wherein the eHDF has a perforated structure.

7. The integrated circuit package of claim 1, wherein a width of the second chip is greater than a width of the first chip.

8. An integrated circuit package comprising:
    a substrate having a top surface and a bottom surface opposite to the top surface;
    a hole in the substrate, the hole extending from the top surface of the substrate to the bottom surface of the substrate;
    an embedded heat dissipation feature (eHDF), the eHDF comprising a first portion within the hole and a second portion over the substrate;
    a first chip over the top surface of the substrate, a sidewall of the first chip facing a sidewall of the first portion of the eHDF; and
    a second chip over the first chip, the second chip being directly over and extending along a top surface of the first portion of the eHDF.

9. The integrated circuit package of claim 8, wherein a bottom surface of the first chip is above the top surface of the first portion of the eHDF.

10. The integrated circuit package of claim 8, wherein a bottom surface of the second chip is above a top surface of the second portion of the eHDF.

11. The integrated circuit package of claim 8, further comprising an encapsulant surrounding the first chip and the second chip, the encapsulant filling the hole.

12. The integrated circuit package of claim ii, wherein the encapsulant extends along a sidewall of a top surface of the second portion of the eHDF and the second chip.

13. The integrated circuit package of claim 8, further comprising a high thermal conductivity adhesive between the second portion of the eHDF and the first chip.

14. The integrated circuit package of claim 8, further comprising a connector bonded to a bottom surface of the first portion of the eHDF.

15. An integrated circuit package comprising:
    a substrate;
    a hole extending through the substrate;
    an embedded heat dissipation feature (eHDF), the eHDF comprising a first portion extending through the hole and a second portion extending over the substrate, wherein the second portion of the eHDF is attached to a top surface of the substrate using a first high thermal conductivity adhesive;
    a first chip attached to the substrate, the first chip being interposed between the first portion of the eHDF and the second portion of the eHDF, wherein the second portion of the eHDF is attached to a top surface of the first chip using a second high thermal conductivity adhesive; and
    an encapsulant extending along sidewalls of the first chip, a portion of the encapsulant extending through the hole.

16. The integrated circuit package of claim 15, further comprising a second chip over the first chip and embedded into the encapsulant, wherein the second chip extends along the top surface of the first portion of the eHDF.

17. The integrated circuit package of claim 16, wherein a sidewall of the second chip faces a sidewall of the second portion of the eHDF.

18. The integrated circuit package of claim 16, further comprising a third chip over the second chip and embedded into the encapsulant, wherein a width of the third chip is greater than a width of the first chip.

19. The integrated circuit package of claim 18, wherein a bottom surface of the third chip is below a top surface of the second portion of the eHDF.

20. The integrated circuit package of claim 15, further comprising a cooling plate over the encapsulant.

\* \* \* \* \*